United States Patent [19]
Kim

[11] Patent Number: 6,091,628
[45] Date of Patent: Jul. 18, 2000

[54] STATIC RANDOM ACCESS MEMORY DEVICE AND METHOD OF MANUFACTURING THE SAME

[75] Inventor: Han-soo Kim, Suwon, Rep. of Korea

[73] Assignee: Samsung Electronics Co., Ltd., Suwon, Rep. of Korea

[21] Appl. No.: 09/204,366

[22] Filed: Dec. 4, 1998

[30] Foreign Application Priority Data

Dec. 31, 1997 [KR] Rep. of Korea .................. 97-82095

[51] Int. Cl.[7] .................................................. G11C 11/00
[52] U.S. Cl. ........................................ 365/154; 365/156
[58] Field of Search ..................................... 365/156, 154

[56] References Cited

U.S. PATENT DOCUMENTS 5,506,802  4/1996  Kiyono ..................................... 365/156

Primary Examiner—Trong Phan
Assistant Examiner—M. Tran
Attorney, Agent, or Firm—Jones Volentine, L.L.P.

[57] ABSTRACT

A semiconductor memory device having a static random access memory (SRAM) cell and a method of manufacturing the same. The SRAM cell includes a semiconductor substrate, two access transistors, two drive transistors, two power supply lines and two word lines. The two access transistors and the two drive transistors are formed of a first conductive layer on a semiconductor substrate. Each of the two power supply lines is formed above the four transistors of a second conductive layer, insulated from the four transistors. Each of the two word lines is formed above the two power supply lines of a third conductive layer, insulated from the two power supply lines and connected to each gate of the two access transistors. Accordingly, in the SRAM cell, parasitic capacitance of the word line is reduced, to thereby increase the operating speed of the memory device.

15 Claims, 18 Drawing Sheets

STATIC RANDOM ACCESS MEMORY DEVICE AND METHOD OF MANUFACTURING THE SAME

BACKGROUND OF THE INVENTION

1. Field of the Invention

The present invention relates to a semiconductor memory device, and more particularly, to a static random access memory (SRAM) and a method of manufacturing the same.

2. Description of the Related Art

Although static random access memory (SRAM) has lower integration density than dynamic random access memory (DRAM), SRAM typically operates at high speed, so that SRAM is widely used for a small or mid-sized computer. A SRAM cell includes a flip-flop circuit composed of two access transistors, two drive transistors add two load devices. Memory information is stored as a difference in voltages between input and output terminals of the flip-flop, i.e., as a charge stored in a node of the cell. The charge is supplied by a power supply $V_{cc}$ through the load device, i.e., a PMOS transistor or a load resistor, so that the SRAM, unlike the DRAM, requires no refresh.

To sustain and enhance the high speed characteristics of the SRAM, the architecture of a chip, such as architectures for a circuit and an interconnect line for a memory cell must be optimized. In particular, line resistance and parasitic capacitance between the lines are determined by a method of arranging the lines.

The parasitic capacitance generated by a word line of a conventional SRAM will be described with reference to FIG. 1. FIG. 1 is a sectional view of two adjacent SRAM are taken along a word line in a CMOS type SRAM chip using a PMOS thin film transistor (TFT) as the load device.

An active region and an inactive region are defined by an isolation layer 12 formed on a semiconductor substrate 10, and a gate 14 of an access transistor and a gate 16 of a drive transistor are formed by interposing a gate insulating layer 13 on the semiconductor substrate 10 and isolation layer 12. A first interlevel dielectric layer 18 and a word line 20 are sequentially stacked on the gates 14 and 16. The word line 20 is connected to the gate 14 of the access transistor through a contact hole formed in the first interlevel dielectric layer 18. A second interlevel dielectric layer 22 and a gate insulating layer 24 of a PMOS TFT are sequentially stacked on the word line 20. A power supply ($V_{cc}$) line 26 formed on the gate insulating layer 24, runs parallel with the word line 20. The power supply line 26 together with a source region of the PMOS TFT form a single body. A third interlevel dielectric layer 28 is stacked on the power supply line 26, and a plurality of bit lines 30 above to the word line 20 are formed on the third interlevel dielectric layer 28.

In a SRAM cell having a structure of FIG. 1, parasitic capacitances C1, C2 and C3 are respectively generated between the word line 20 and the power supply line 26, between the word line 20 and the substrate 10, and between the word line 20 and the gate electrode 16 of the drive transistor. Considering that each word line is connected to all horizontal adjacent cells in common, the total amounts of the parasitic capacitances C1, C2 and C3 produce a delay (RC) associated with the word line. Also, considering that every two word lines are arranged in each cell of all the adjacent vertical cells, the parasitic capacitances of the word line cause a reduction in the operational speed of the chip and a deterioration in chip performance.

SUMMARY OF THE INVENTION

It is an object of the present invention to provide a static random access memory (SRAM) cell minimizing parasitic capacitance generated by a word line.

It is another object of the present invention to provide a method of manufacturing the SRAM cell.

Accordingly, to achieve one object of the present invention, a SRAM cell includes two access transistors, two drive transistors, two power supply lines and two word lines. Each of the two access transistors and the two drive transistors is formed of a first conductive layer on a semiconductor substrate. Each of the two power supply lines is formed of a second conductive layer, above the four transistors, insulated from the four transistors. Each of the two word lines is formed of a third conductive layer, above the two power supply lines, insulated from the two power supply lines and connected to a gate of one of the two access transistors.

The two power supply lines and the two word lines run parallel with one another along the length of the word lines.

The memory cell further comprises two load devices. In a preferred embodiment the two load devices are thin film transistors of a PMOS type, and each of the two power supply lines is connected to an active region of each of the thin film transistors. In another preferred, the two load devices are two high-valued polysilicon resistors, and each of the two power supply lines is connected to each of the two high-valued polysilicon resistors.

Also, the memory cell further comprises a ground line formed of a conductive layer the same as the third conductive layer for forming the word lines, and connected to an active region of each of the two drive transistors, and two bit lines formed above the two word lines, and insulated from the two word lines.

The memory cell further comprises two bit lines insulated from the two word lines, formed above to the two word lines. Preferably, each of the two bit lines comprises a contact plug formed in first and second interlevel dielectric layers for insulating the semiconductor substrate, the power supply lines and the word lines respectively, and a fourth conductive layer pattern deposited in a contact hole formed in a third interlevel dielectric layer for insulating the word line and the bit line to expose the contact plug.

Alternatively, to achieve one object of the present invention, a SRAM cell includes two access transistors, two drive transistors, a power supply line and a word line. The two access transistors and the two drive transistors are formed on a semiconductor substrate, and formed of a first conductive layer. The power supply line is formed of a second conductive layer, above the four transistors, insulated from the four transistors. The word line is formed of a third conductive layer, above the power supply line, insulated from the power supply line and connected to each gate of the two access transistors.

To achieve another object, in a preferred embodiment of a method of manufacturing a memory device according to the present invention, a first conductive layer pattern is formed on a semiconductor substrate. Then, an impurity is implanted into the entire surface of the resultant structure where the first conductive layer is formed, to thereby form two access transistors having a first conductive layer pattern as a gate electrode and two driving transistors. Subsequently, a first interlevel dielectric layer is formed on the resultant structure where the four transistors are formed, and then two power supply lines formed of a second conductive layer pattern are formed on the first interlevel dielectric layer. After forming the second interlevel dielectric layer on the two power supply lines, the second interlevel dielectric layer and the first interlevel dielectric layer are etched, to form two contact holes each exposing a gate of one of the two access transistors. A third conductive layer pattern burying the two contact holes is formed, to thereby form two word lines connected to the gates of the two access transistors.

The second conductive layer pattern for forming the power supply line and the third conductive layer pattern for forming the word line are arranged parallel with one another along the direction of the line length.

Preferably, after the step of forming the first interlevel dielectric layer, two gate electrodes of two thin film transistors are formed on the first interlevel dielectric layer, and then a gate insulating layer is formed on the resultant structure where the gate electrodes of the two thin film transistors are formed. Also, a second conductive layer pattern is formed on the gate insulating layer, and then an impurity is implanted into a region other than a region to be formed as the channels of the thin film transistors, to form load devices comprised of two thin film transistors and two power supply lines.

According to another embodiment of a method of forming the two power supply lines, preferably a second conductive layer pattern formed of polysilicon is formed on the first interlevel dielectric layer, and then an impurity is implanted into a region other than the region to be formed as a high-valued resistance load, to thereby form two high-valued resistors and two power supply lines.

After forming the second interlevel dielectric layer, in a preferred embodiment the second interlevel dielectric layer is planarized, and then the planarized second interlevel dielectric layer is partially etched, to thereby form two damascene regions where two word lines are to be formed. Also, the second interlevel dielectric layer where the damascene regions are formed and the first interlevel dielectric layer are etched, to thereby form two contact holes each exposing a gate of one of the two access transistors. Then, after forming a third conductive layer burying the two contact holes and the two damascene regions, the third conductive layer is planarized until the surface of the second interlevel dielectric layer is exposed, to thereby form two word lines connected to gates of the two access transistors. Preferably, after forming the two word lines, the following steps are performed. After forming the third interlevel dielectric layer, the third, second and first interlevel dielectric layers are etched, to thereby form a contact hole exposing an active region of the semiconductor substrate. Then, fourth conductive layer patterns burying the contact hole are formed on the third interlevel dielectric layer, above to the two word lines, to thereby form two bit lines.

Alternatively, after the step of forming the second interlevel dielectric layer, the second interlevel dielectric layer is planarized, and the planarized second interlevel dielectric layer is partially etched, to thereby form a damascene region where a word line is to be formed, and a damascene region where a ground line is to be formed. Then, the second interlevel dielectric layer where the damascene regions are formed, and the first interlevel dielectric layer are etched, to thereby form two contact holes each exposing the gate of one of the two transfer transistors and two contact holes each exposing an active region of one of the two drive transistors. Subsequently, after forming a third conductive layer burying the contact holes and the damascene regions, the third conductive layer is planarized until the surface of the second interlevel dielectric layer is exposed, to thereby form a word line connected to gates of the two transfer transistors and a ground line connected to the active regions of the two drive transistors.

After forming the second interlevel dielectric layer, the process may be performed as follows. After planarizing the second interlevel dielectric layer, the second interlevel dielectric layer having the damascene region where the word line is to be formed and the first interlevel dielectric region are etched, to thereby form two contact holes each exposing a gate of one of the two access transistors and two contact holes exposing the active regions of the semiconductor substrate. Subsequently, after forming the third conductive layer burying the contact holes and the two damascene regions, the third conductive layer is planarized until the surface of the second interlevel dielectric layer is exposed, to thereby form two word lines connected to gates of the two access transistors and a contact plug connected to the active region on the substrate. Then, a third interlevel dielectric layer is formed on the entire surface of the resultant structure where the two word lines and the two contact plugs are formed. Subsequently, the third interlevel dielectric layer is etched, to thereby form two contact holes exposing the two contact plugs, and then two fourth conductive layer patterns burying the two contact holes exposing the two contact plugs are formed, to thereby form two bit lines.

An SRAM device according to the present invention exhibits a reduced parasitic capacitance for the word line, so that the RC delay problem generated by the word line during operation of the SRAM device is also reduced, thereby enhancing the operational characteristics of the SRAM device.

BRIEF DESCRIPTION OF THE DRAWINGS

The above objects and advantages of the present invention will become more apparent by the following description with reference to the attached drawings in which.

DESCRIPTION OF THE PREFERRED EMBODIMENTS

Figure 1:
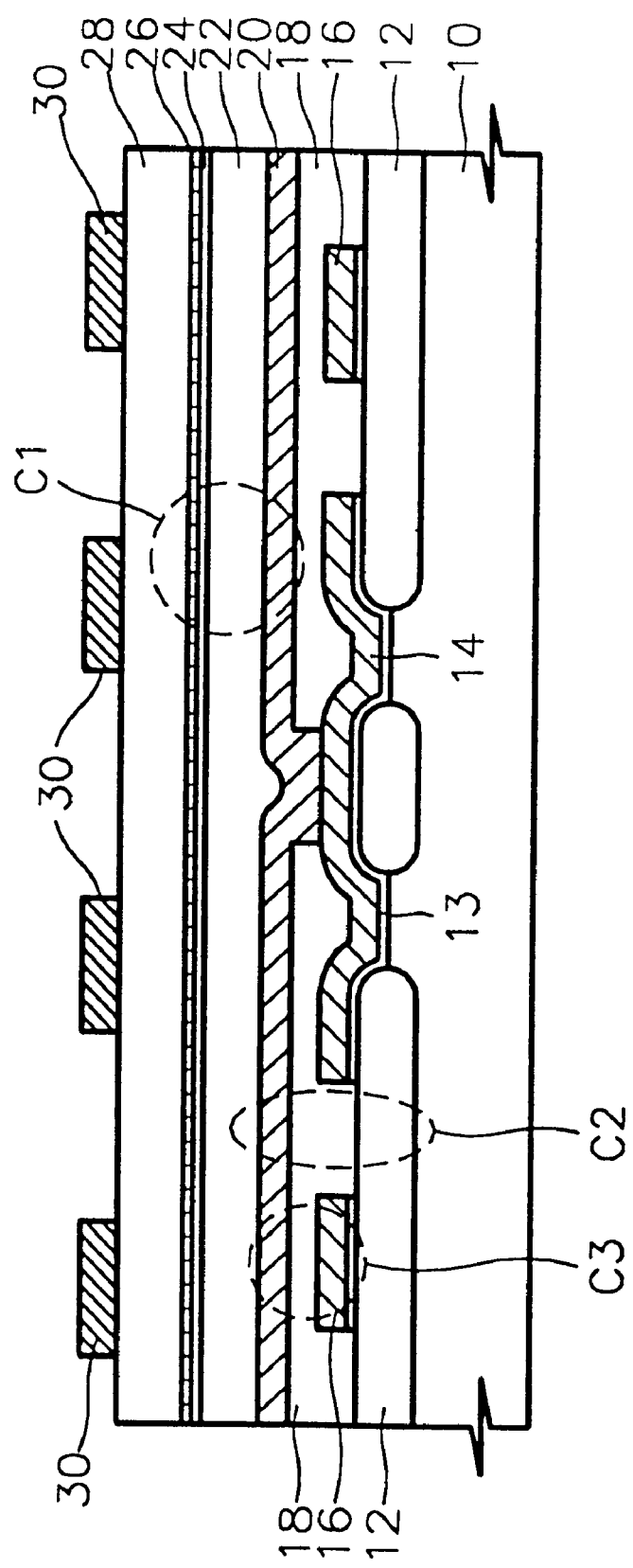
FIG. 1 is a sectional view of a conventional SRAM chip using a PMOS transistor as a load device, in which two adjacent cells are taken along a word line.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Embodiment 1

In a first embodiment, a SRAM cell using a PMOS TFT as a load device is realized.

Figure 2:
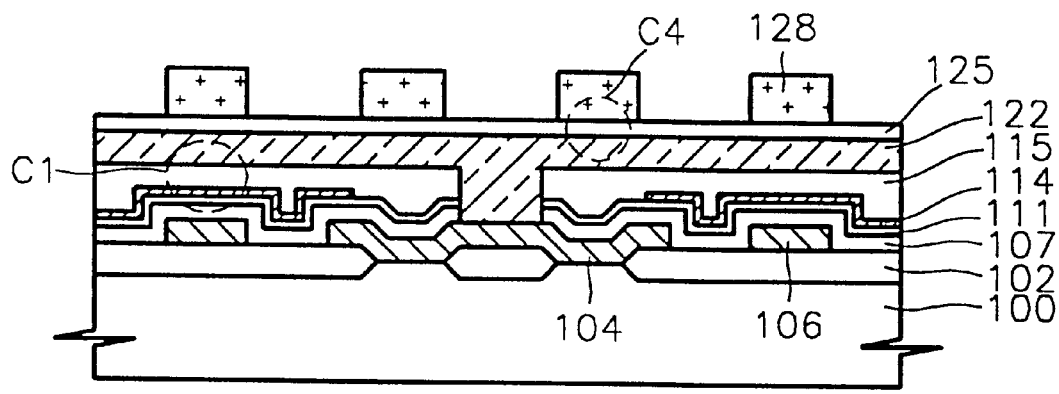
FIG. 2 is a sectional view of a SRAM chip using a PMOS transistor as a load device according to a first embodiment of the present invention, in which two adjacent cells are taken along a word line.

Referring to FIG. 2, an active region and an inactive region of a semiconductor substrate 100 are defined by an isolation layer 102. A gate 104 of an access transistor and a gate 106 of a drive transistor which are formed a same conductive layer are formed on the semiconductor substrate 100. A first interlevel dielectric layer 107 and a gate insulating layer 111 of a PMOS TFT are sequentially stacked on the gates 104 and 106. A conductive layer pattern 114 simultaneously used as both an active region of the PMOS TFT and a power supply line are formed on the gate insulating layer 111, and a second interlevel dielectric layer 115 is stacked on the entire surface of the resultant structure where the conductive layer pattern 114 is formed. A word line 122 connected to the gate 104 of the access transistor is formed on the second interlevel dielectric layer 115 passing through a contact hole in the second interlevel dielectric layer 115, the gate insulating layer 111 and the first interlevel dielectric layer 107 to expose the gate 104 of the access transistor. A plurality of bit lines 128 insulated from the word line 122 by a third interlevel dielectric layer 125 are formed above to the word line 122.

As shown in FIG. 2, in a CMOS SRAM using the PMOS TFT as a load device according to the first embodiment of the present invention, the word line 122 is shielded from a lower conductive region, such as a gate 106, by the power supply line 114, so that a parasitic capacitance (see C2 of FIG. 1) between the word line 122 and the semiconductor substrate 100, and a parasitic capacitance (see C3 of FIG. 1) between the word line 122 and the gate electrode 106 of the drive transistor are not generated. That is, the parasitic capacitances of the word line 122 are reduced, to thereby increase the operational speed and performance of the SRAM.

Also, the parasitic capacitance C1 between the power supply line 114 and the word line 122 is effectively reduced by increasing a thickness of the second interlevel 10 dielectric layer 115 for insulating the word line 122 from the power supply line 114. This is because the PMOS TFT is already formed under the power supply line 114, so that only the word line 122 and the bit line 128 are affected even though the thickness of the second interlevel dielectric layer 115 increases.

However, a parasitic capacitance C4 between the word line 122 and the bit line 128 may be formed, but the parasitic capacitance C4 can be sufficiently reduced by increasing the thickness of the third interlevel dielectric layer 125. Although the step increases when the thickness of the third interlevel dielectric layer 125 increases, only the bit line 128 is affected by the step. The step caused by increasing the third interlevel dielectric layer 125 may be reduced by forming a contact hole for contacting the active region with the bit line 128 using a contact plug (see 120P of FIG. 11B).

In the conventional SRAM of FIG. 1, when the thicknesses of the first and second interlevel dielectric layers 18 and 22 are increased to reduce the parasitic capacitances C2 and C3, the step is further increased during forming the word line 20. In particular, formation of the conductive layer for the active region of the PMOS TFT on the word line 20 excessively increases the step. Thus, there is a limit how much the thickness of the interlevel dielectric layer may be increased in order to reduce the parasitic capacitance.

Embodiment 2

Figure 3:
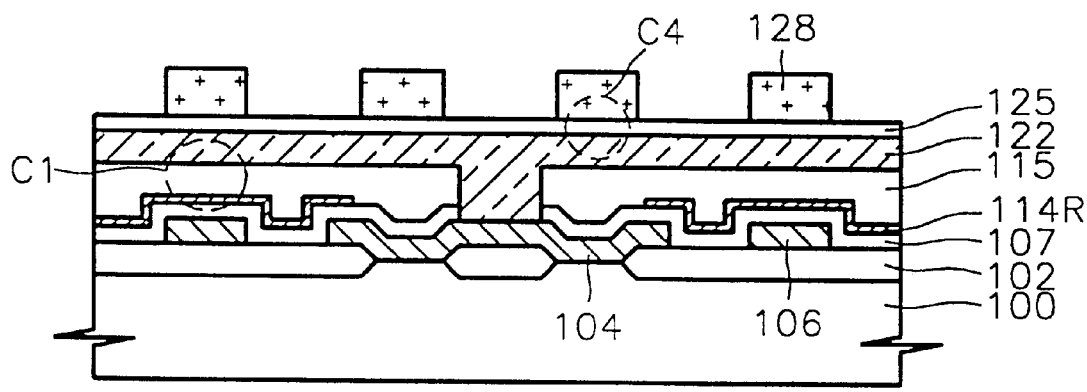
FIG. 3 is a sectional view of a SRAM chip using high-valued polysilicon resistors as a load device according to a second embodiment of the present invention, in which two adjacent cells are taken along a word line.

Referring to FIG. 3, in a second embodiment, a high-valued polysilicon resistor is used as a load device. Accordingly, the PMOS TFT gate (not shown) and the insulating layer 111 of the first embodiment are unnecessary, and a power supply line 114R in a single body with the high-valued resistor, (instead of the power supply line (114 of FIG. 2) in a single body with the PMOS TFT active region), is formed on the first interlevel dielectric layer 107. Other elements and the structure are similar to those of the first embodiment.

The word line 122 is formed on the power supply line 114R so that parasitic capacitances between the word line 122 and the gate 106 of the drive transistor and between the word line 122 and the substrate are not generated, to thereby increase the operational speed of the SRAM cell.

The structure according to the present invention may be applied to a full-CMOS type SRAM using a PMOS transistor as a load device.

Embodiment 3

Figure 23:
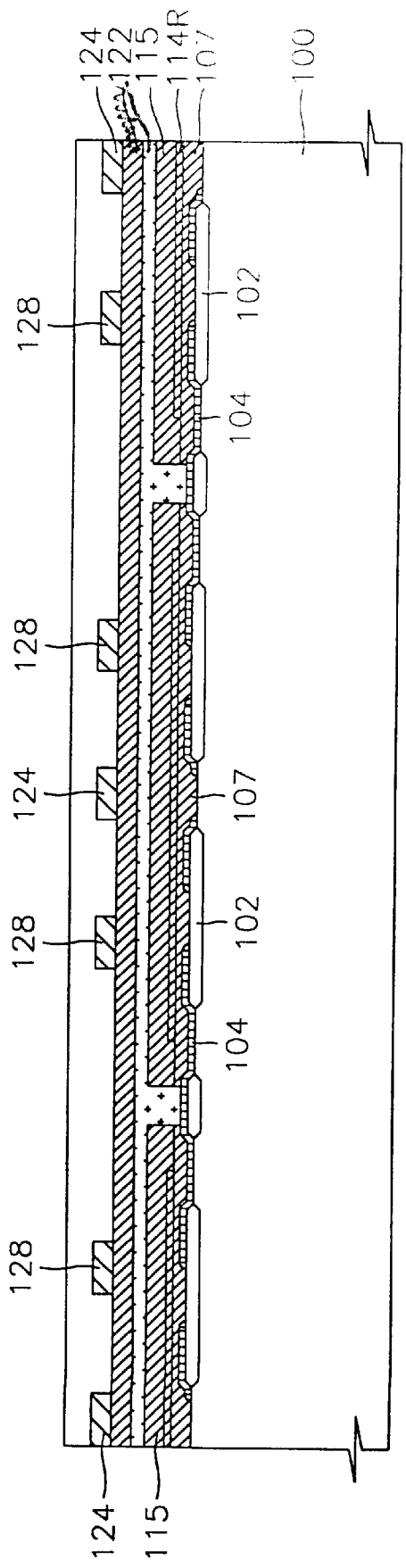
FIG. 23 is a section view of the SRAM chip according to the third embodiment, taken along line BB' of FIG. 22.

Referring to FIG. 23, in a third embodiment, a SRAM cell using a single word line 122 and a single power supply line 114R as a load device is realized. In the embodiment shown in FIG. 23, like reference numerals represent the same elements as in FIG. 3.

Method for manufacturing a SRAM cell

In FIGS. 4, 5, 6, 7, 8, 9, 10, 11, 12 and 13, cross-hatched areas in each figure represent mask patterns formed on a piece of a photomask. For convenience, four adjacent SRAM cells are depicted in FIGS. 4, 5, 6, 7, 8, 9, 10, 11, 12 and 13. Also, FIGS. 4A, 5A, 6A, 7A, 8A, 9A, 10A, 11A, 12A and 13A and 4B, 6B, 7B, 8B, 9B, 10B, 11B, 12B, and 13B, each illustrate a sectional view of an intermediate structure of the SRAM cells manufactured using mask patterns of the layout diagrams, taken along lines AA' and BB' respectively of FIGS. 4, 5, 6, 7, 8, 9, 10, 11, 12 and 13.

Figure 4:
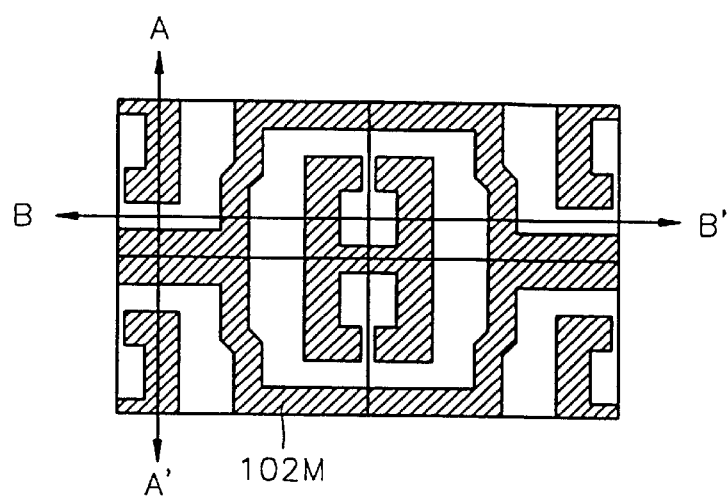
FIGS. 4, 5, 6, 7, 8, 9, 11, 12 and 13 are layout diagrams of mask patterns for manufacturing the SRAM chip according to the first embodiment of the present invention.
Figure 4A:
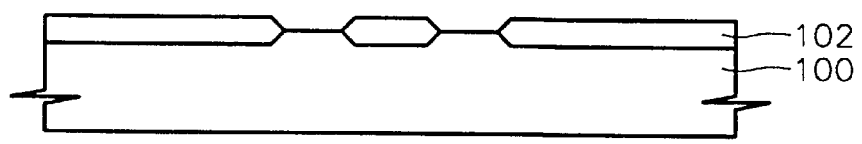
FIGS. 4A, 5A, 6A, 7A, 8A, 9A, 10A, 11A, 12A, and 13A and 4B, 5B, 6B, 7B, 8B, 9B, 10B, 11B, 12B, and 13B are sectional views of intermediate structures illustrating for a fabrication method of SRAM chip, taken along lines AA' and BB' respectively of FIGS. 4, 5, 6, 7, 8, 9, 10, 11, 12, and 13.
Figure 4B:
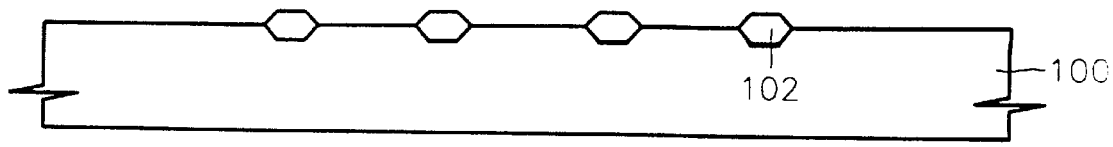

FIGS. 4, 4A and 4B illustrate the formation of a field oxide layer 102 on a semiconductor substrate 100 using a mask pattern 102M defining an active region. The field oxide layer 102 is formed by a typical method, e.g., a local oxidation (LOCOS) method. The field oxide layer 102 of one memory cell is a mirror image of that of an adjacent memory cell.

Figure 5:
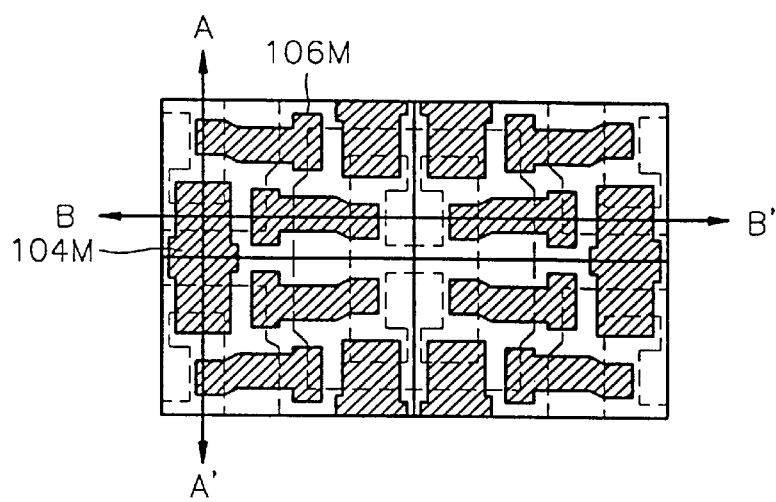
Figure 5A:
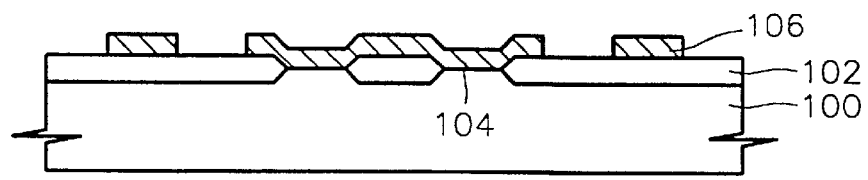
Figure 5B:
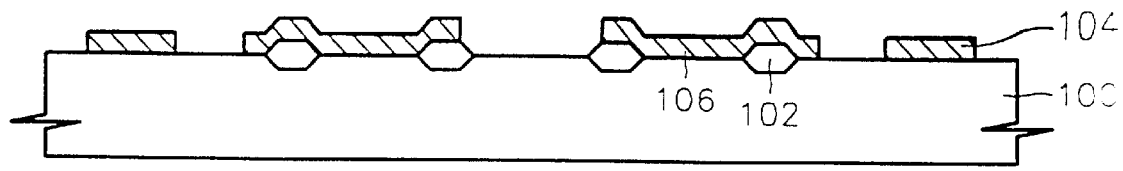

FIGS. 5, 5A and 5B illustrate the formation of an access transistor and a drive transistor using mask patterns 104M and 106M defining a gate of the access transistor and a gate of the drive transistor.

A gate insulating film (not shown) is formed on the entire surface of the semiconductor substrate 100 where the field oxide layer 102 is formed, and then a conductive material, e.g., polysilicon is deposited, or the polysilicon and silicide are stacked, to form a conductive layer. Subsequently, the conductive layer is patterned by photolithography using the mask patterns 104M and 106M. As a result, the gates 104 of two access transistors and the gates 106 of the two drive transistors are formed on a memory cell.

Then, an impurity, e.g., phosphorus or arsenic is ion-implanted to the entire surface of the resultant structure where gates of the transistors 104 and 106 are formed and thus the active regions of the access transistor and the drive transistor, i.e., source and drain regions are formed, to thereby complete each transistor.

Figure 6:
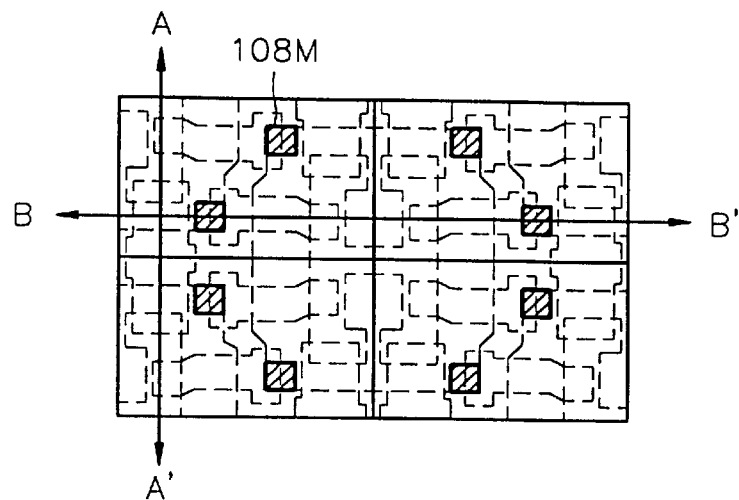
Figure 6A:
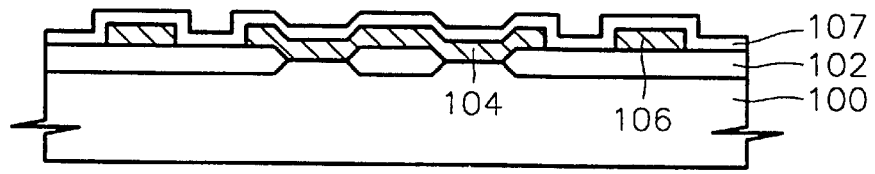
Figure 6B:
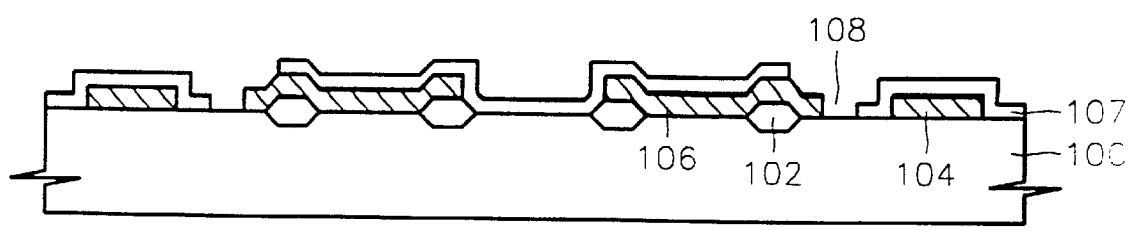

FIGS. 6, 6A and 6B illustrate the formation of a contact hole 108 using a mask pattern 108M defining a contact hole for a cell node for connecting cells.

A first interlevel dielectric layer 107 is formed on the entire surface of the resultant structure where a access transistor and a drive transistor are formed. Then, the first interlevel dielectric layer 107 is partially eliminated using a photolithography process using a mask pattern 108M of FIG. 6, to thereby form the cell node contact hole 108 for exposing part of the gate 106 of the drive transistor and a source region of the access transistor.

Figure 7:
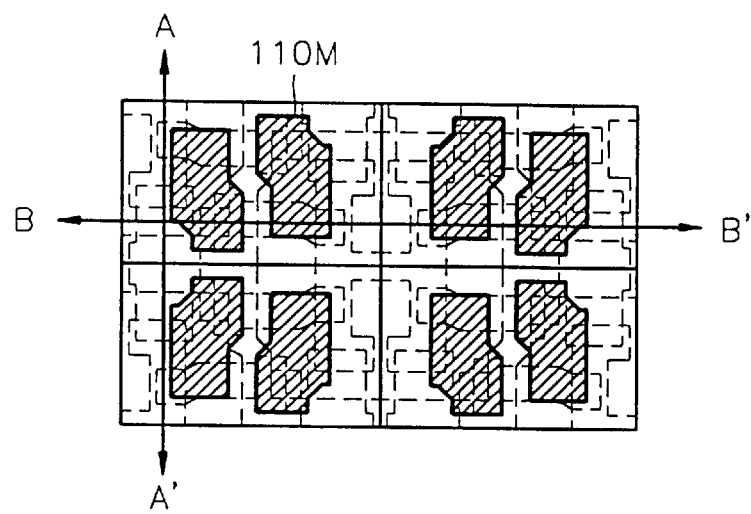
Figure 7A:
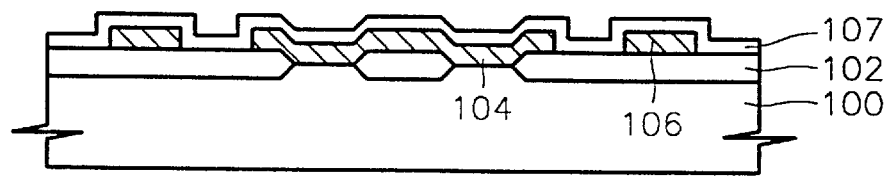
Figure 7B:
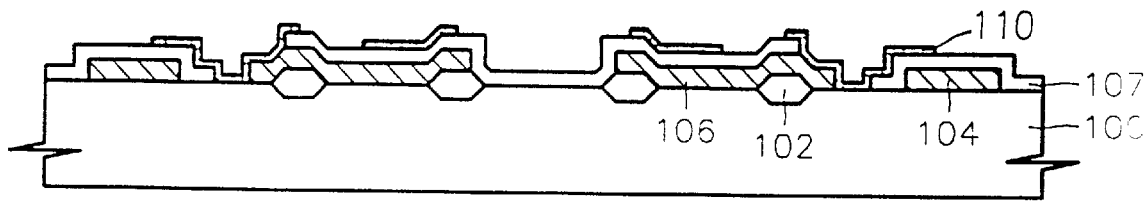

FIGS. 7, 7A and 7B illustrate the formation of a gate 110 of a PMOS TFT using a mask pattern 110M defining the gate of the PMOS TFT.

A conductive layer is deposited on the entire surface of the resultant structure where the cell node contact hole 108 is formed, and then the conductive layer is patterned by a photolithography process using the mask pattern 110M of FIG. 7 to form the gate 110 of the PMOS TFT. Two gates 110 of the PMOS TFT are formed in each memory cell. The gate 110 of the PMOS TFT contacts with part of the gate 106 of the drive transistor and a source region of the access transistor through the cell node contact hole 108.

Figure 8:
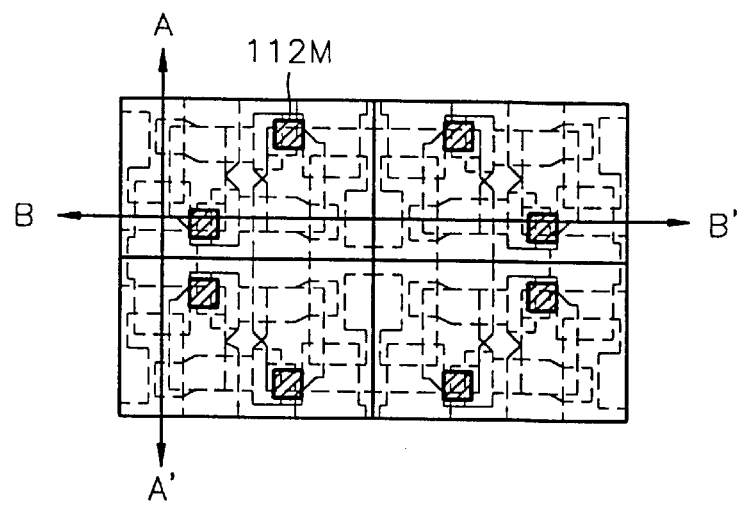
Figure 8A:
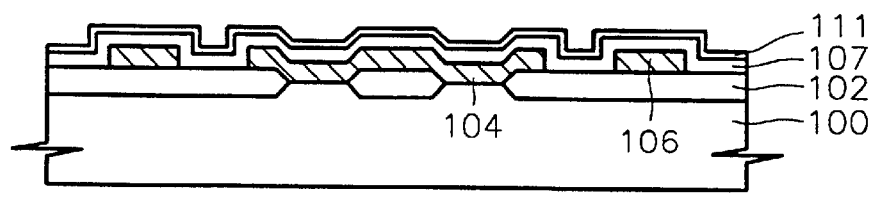
Figure 8B:
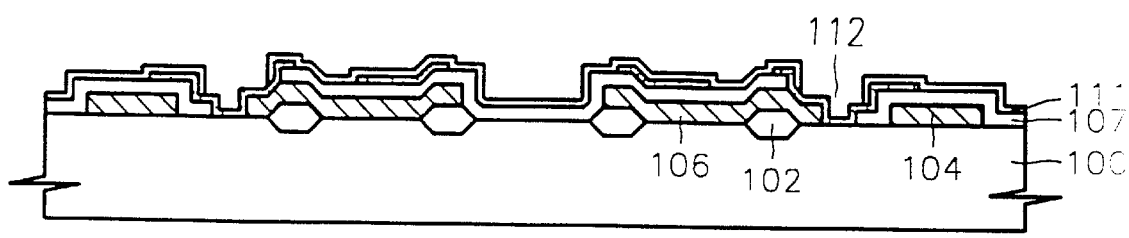

FIGS. 8, 8A and 8B illustrate the formation of a contact hole 112 for contacting a drain of a PMOS TFT to the cell node through a photolithography process using the mask pattern 112M defining a node contact hole.

A gate insulating layer 111 is formed on the entire surface of the resultant structure where a gate 110 of a PMOS TFT is formed, and then the formed gate insulating layer is etched using the mask pattern 112M of FIG. 8, to thereby form the contact hole 112 exposing part of the gate 110 of a PMOS TFT contacting with a drain region of a drive transistor.

Figure 9:
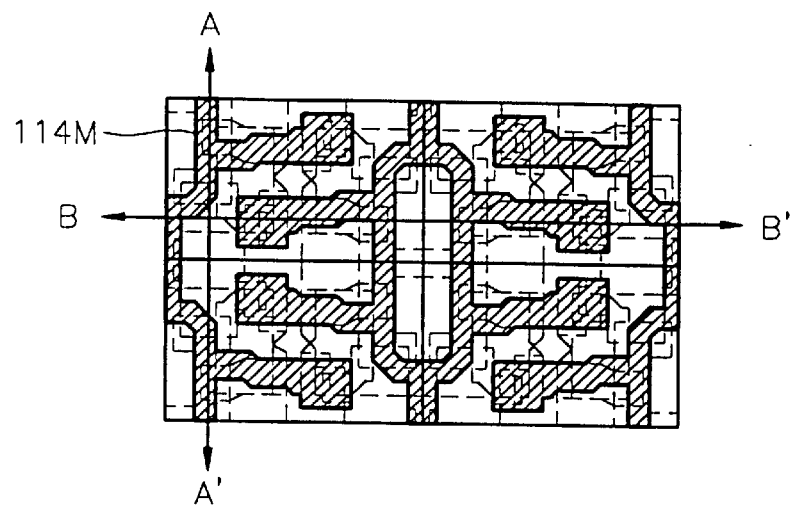
Figure 9A:
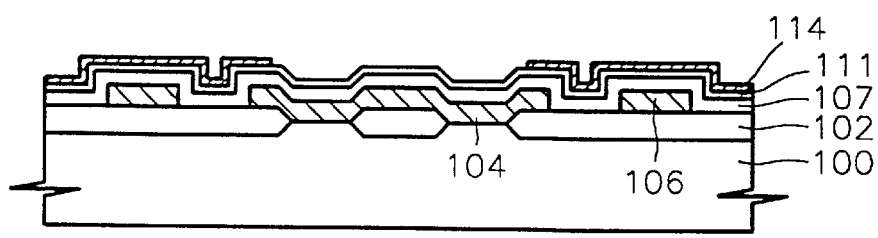
Figure 9B:
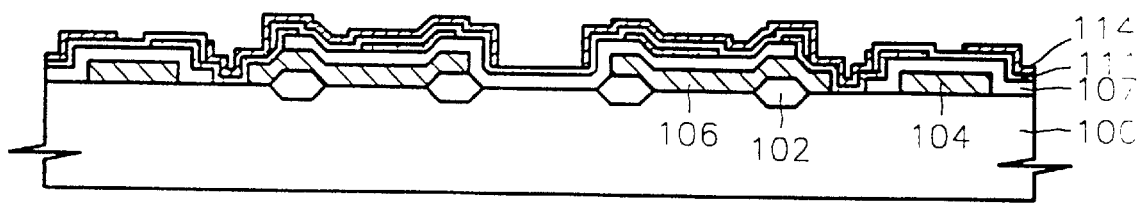

FIGS. 9, 9A and 9B illustrate the formation of an active region of a PMOS TFT and a power supply line 114 using a mask pattern 114M defining the active region of the PMOS TFT and the power supply line.

A conductive layer such as an amorphous silicon layer is deposited on the entire surface of the resultant structure where a contact hole 112 exposing part of the gate 110 of the PMOS TFT is formed, and then the conductive layer is patterned through a photolithography process using the mask pattern 114M of FIG. 9. As a result, the active regions of the two PMOS TFTs and two power supply lines 114 are formed in each memory cell.

An impurity, e.g. boron, is ion-implanted into a region of the PMOS TFT except for a portion to be formed as a channel region using a mask pattern (not shown) defining a source and a drain of the PMOS TFT to form the source and drain of the PMOS TFT.

Figure 10:
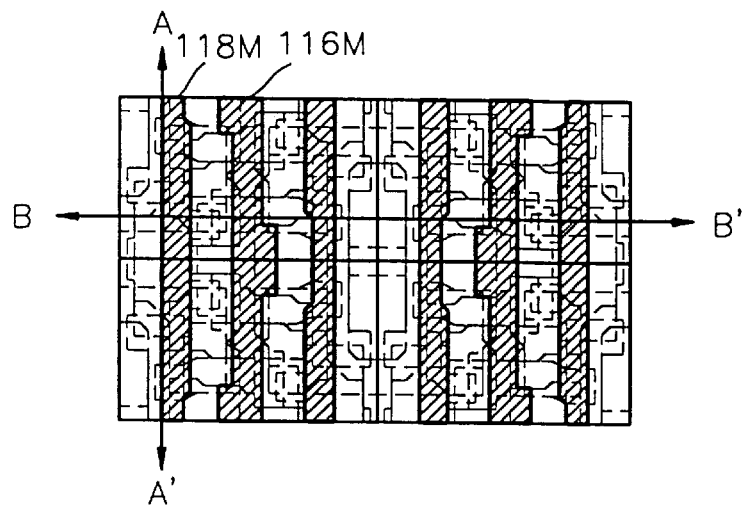
Figure 10A:
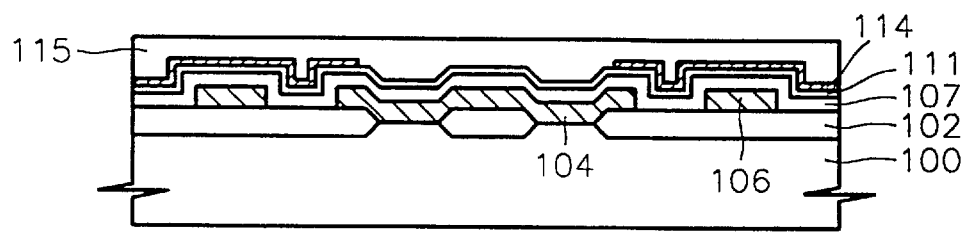
Figure 10B:
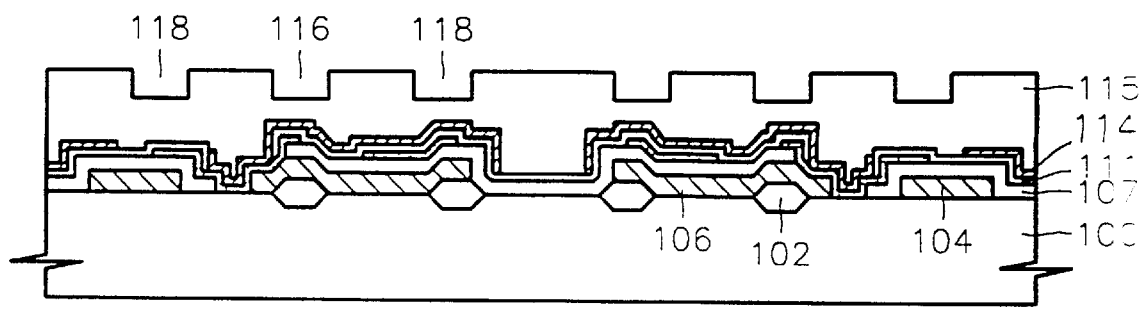

FIGS. 10, 10A and 10B illustrate the formation of a damascene region 116 where a ground line is to be formed and a damascene region 118 where a word line is to be formed, using mask patterns 116M and 118M defining the ground line and a word line.

A second interlevel dielectric layer 115 is deposited on the entire surface of the resultant structure where an active region of a PMOS TFT and a power supply line 114 are formed. The second interlevel dielectric layer 115 is for insulating the active region of the PMOS TFT and the power supply line from a word line and a ground line to be formed in a following process. The second interlevel dielectric layer 115 can be formed by depositing an oxide layer, such as a high temperature oxide layer, as a single layer or by forming a flowable insulating layer such BPSG or PSG on the high temperature oxide layer, and then planarizing the flowable insulating layer using a chemical mechanical polishing (CMP) method.

The second interlevel dielectric layer 115 is partially etched by a damascene method using mask patterns 116M and 118M of FIG. 10 to form the damascene region 116 where the ground line is to be formed and the damascene region 118 where the word line is to be formed.

Figure 11:
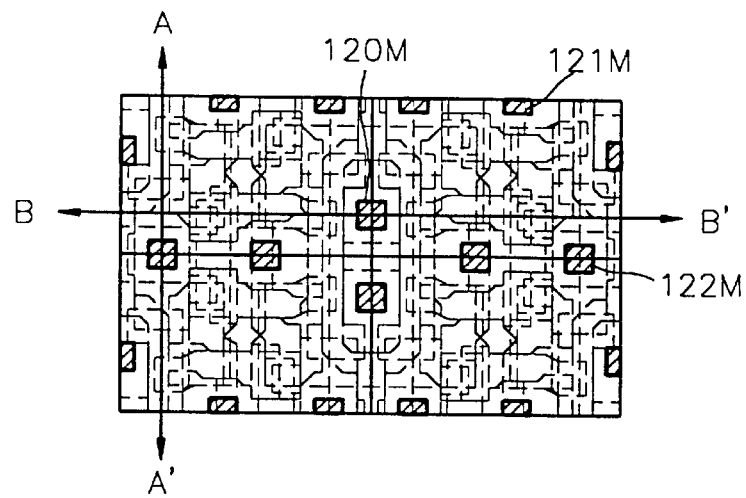
Figure 11A:
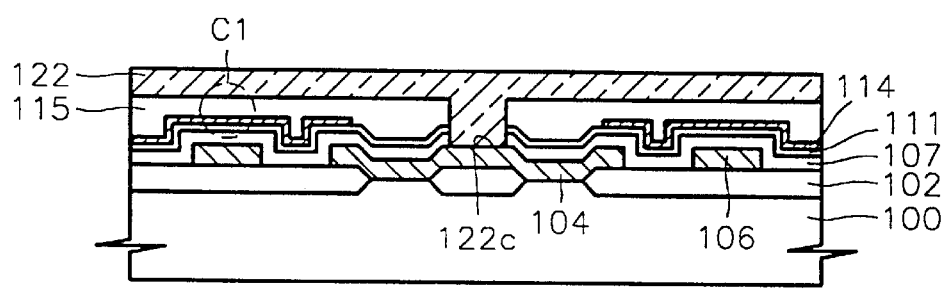
Figure 11B:
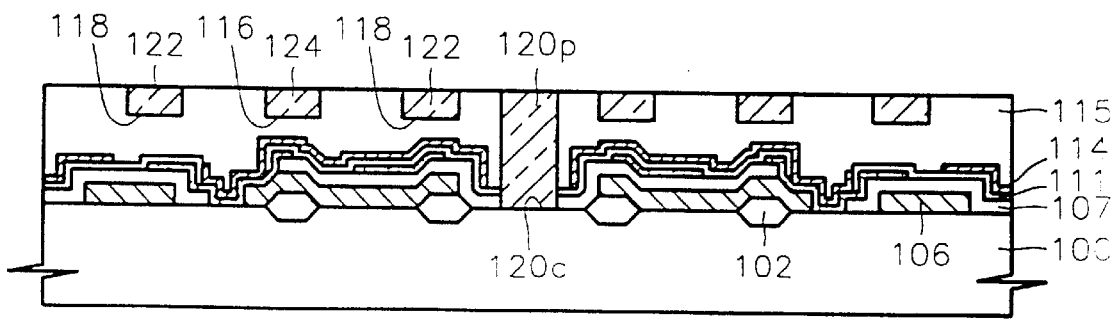

FIGS. 11, 11A and 11B illustrate the formation of a contact hole 120C for connecting a bit line, to be formed in a following process, to an active region, a contact hole (not shown in FIGS. 11A and 11B) for connecting a ground line to be formed in a following process to an active region, and a contact region 122C for connecting a word line to be formed in a following process to a gate 104 of an access transistor using a plurality of contact mask patterns 120M, 121M and 122M, and then forming a contact plug 120P for a bit line, a word line 122 and a ground line 124.

After forming the damascene region 116 where the ground line is to be formed and the damascene region 118 where the word line is to be formed then a second interlevel dielectric layer 115 is etched by a photolithography process using the contact hole mask patterns 120M, 121M and 122M of FIG. 11, to thereby form the contact holes 120C, the contact hole for connecting the ground line to an active region (not shown in FIGS. 11A and 11B), and 122C.

Subsequently, a metal layer, e.g. a tungsten layer, is formed on the entire surface of the resultant structure, and then the metal layer is planarized through CMP until a surface of the second interlevel dielectric layer 115 is exposed. Thus, the contact hole 122C for connecting the word line to the gate 104 of the access transistor and the damascene region 118 where the word line is to be formed are filled with a metal layer to form a word line 122, and the damascene region 116 where the ground line is to be formed is filled with a metal layer to form a ground line 124. Also, the contact plug 120P is formed in the contact hole 120C for connecting the bit line to the active region. As a result, two word lines 122, a ground line 124 and two contact plugs 120P for a bit line are formed in each memory cell.

As shown in FIG. 11A, the word line 122 is parallel to the power supply line 114, and the second interlevel dielectric layer 115 is interposed between the word line 122 and the power supply line 114. Thus, parasitic capacitances C2 and C3 of FIG. 1 are not formed between the word line 114 and the gate 106 of the drive transistor.

The parasitic capacitance C1 generated between the word line 122 and the power supply line 114 can be reduced by increasing the thickness of the second interlevel dielectric layer 115 within a range that operational characteristics of the SRAM cell may not be deteriorated. Since almost all lower structures except the bit line are already formed, increase in the step according to the increase in the thickness of the second interlevel dielectric layer 115 does little affect to a subsequent process.

Figure 12:
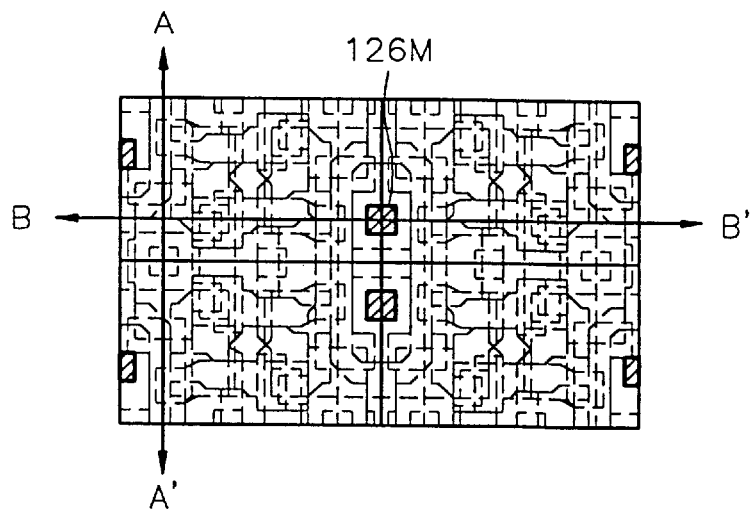
Figure 12A:
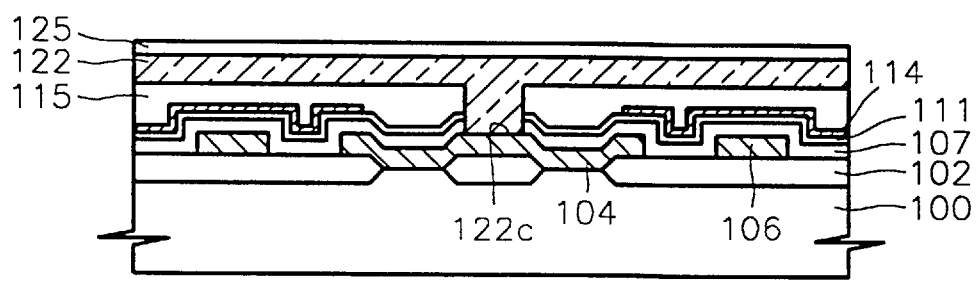
Figure 12B:
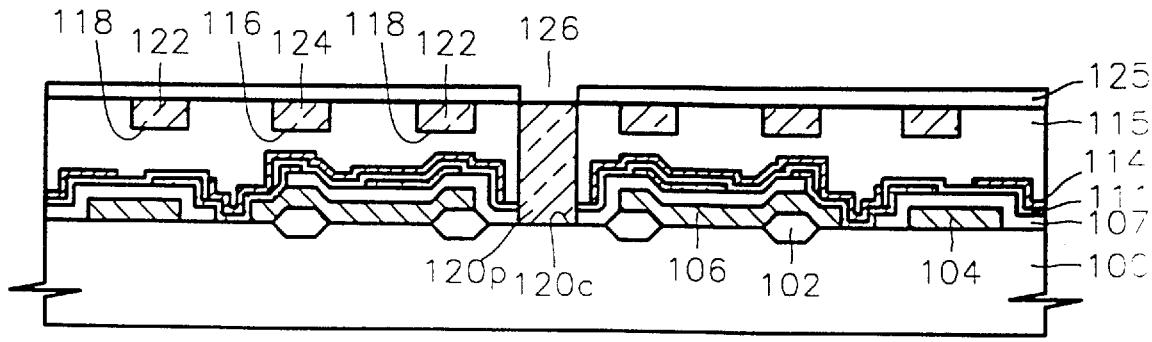

FIGS. 12, 12A and 12B illustrate the formation of a contact hole 126 for a bit line using a mask pattern 126M defining the contact hole for exposing a contact plug 120P for a bit line.

A third interlevel dielectric layer 125 is formed on the entire surface of the resultant structure where the contact plug 120P for a bit line, a word line 122 and a ground line 124 are formed. The third interlevel dielectric layer 125 is formed to insulate the word line 122 and the ground line 124 from the bit line to be formed in a following process.

The third interlevel dielectric layer 125 is etched by a photolithography process using the mask pattern 126M of FIG. 12, to thereby form a contact hole 126 for exposing the contact plug 120P for a bit line.

Figure 13:
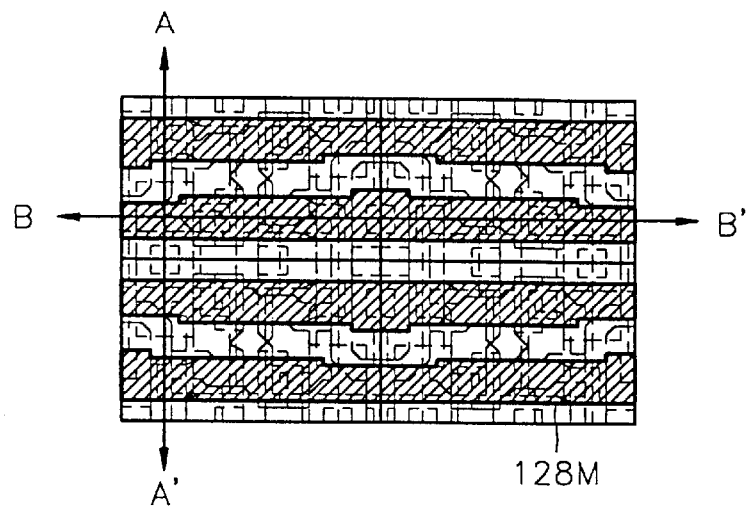
Figure 13A:
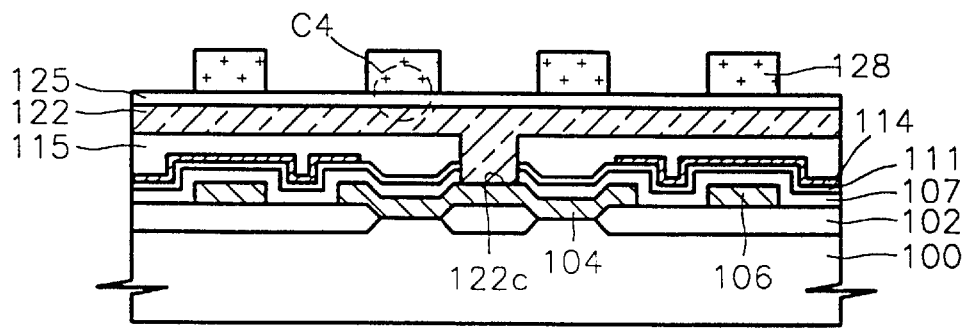
Figure 13B:
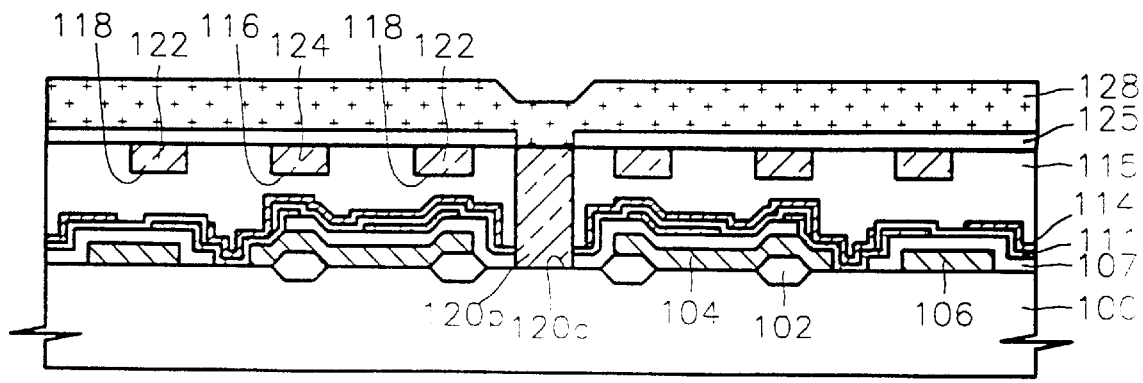
Figure 14:
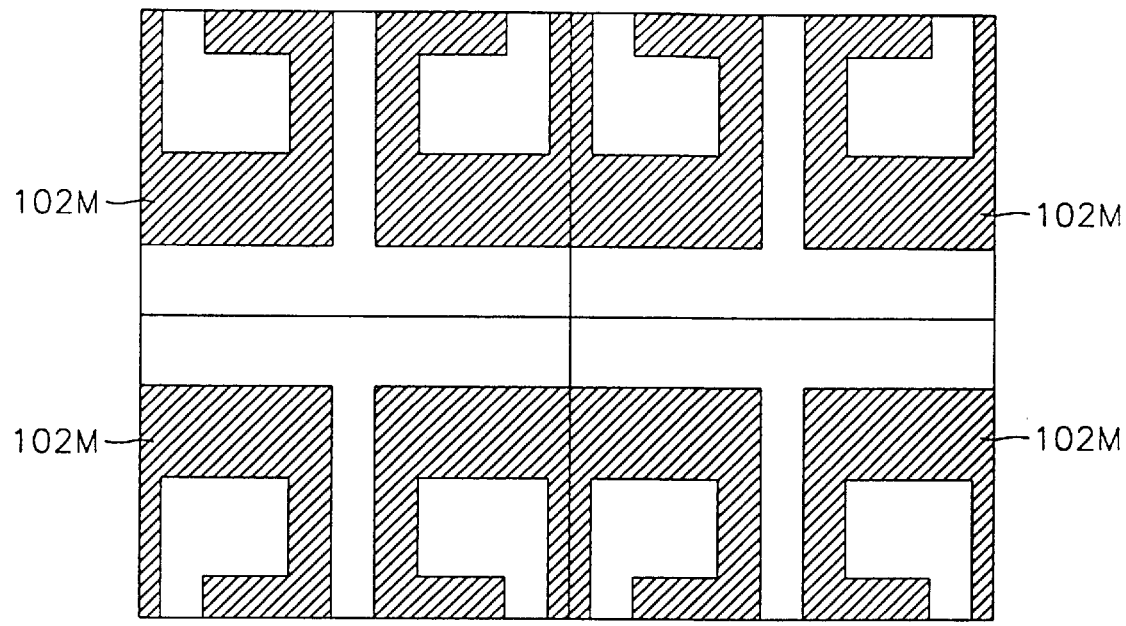
FIGS. 14–22 are layout diagrams of mask patterns for manufacturing the SRAM chip according to a third embodiment of the present invention wherein the SRAM has a single word line and a single power supply line.
Figure 15:
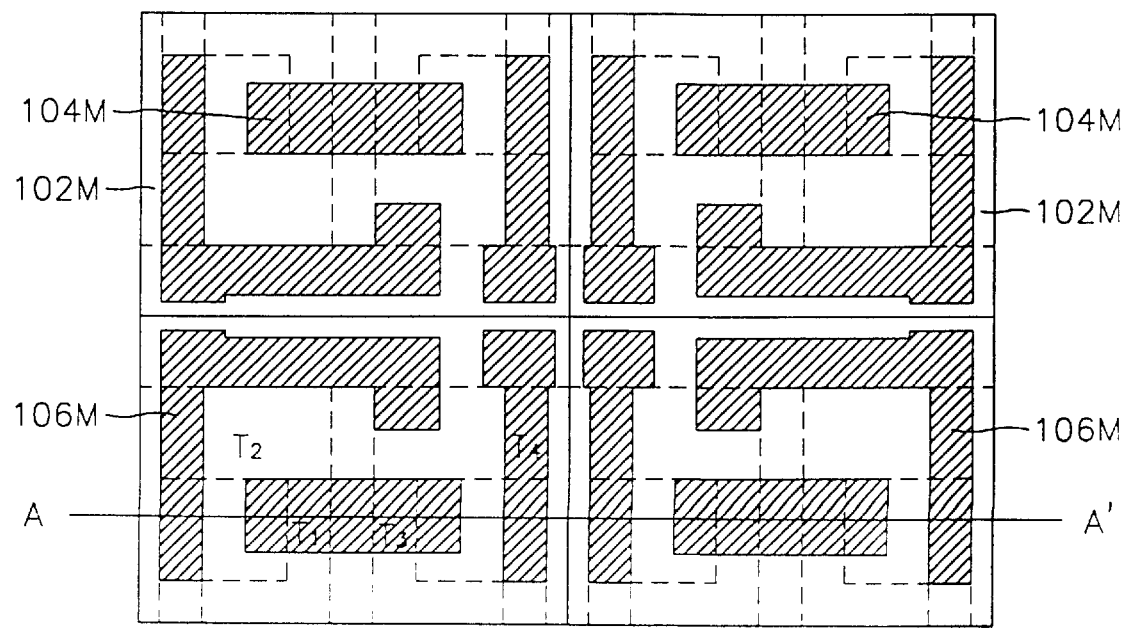
Figure 16:
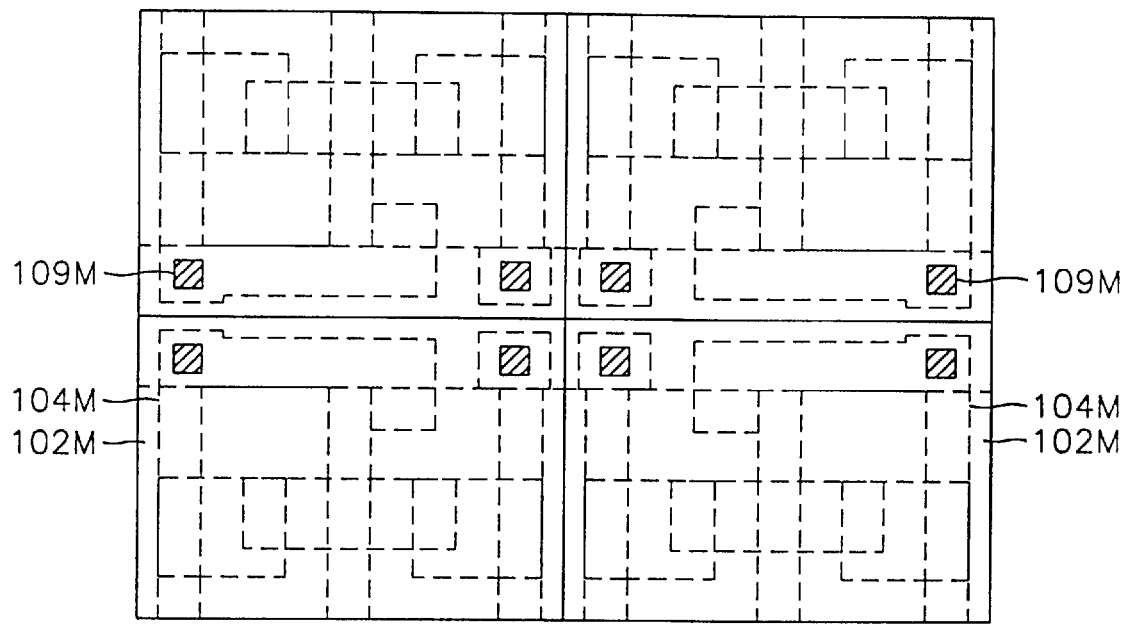
Figure 17:
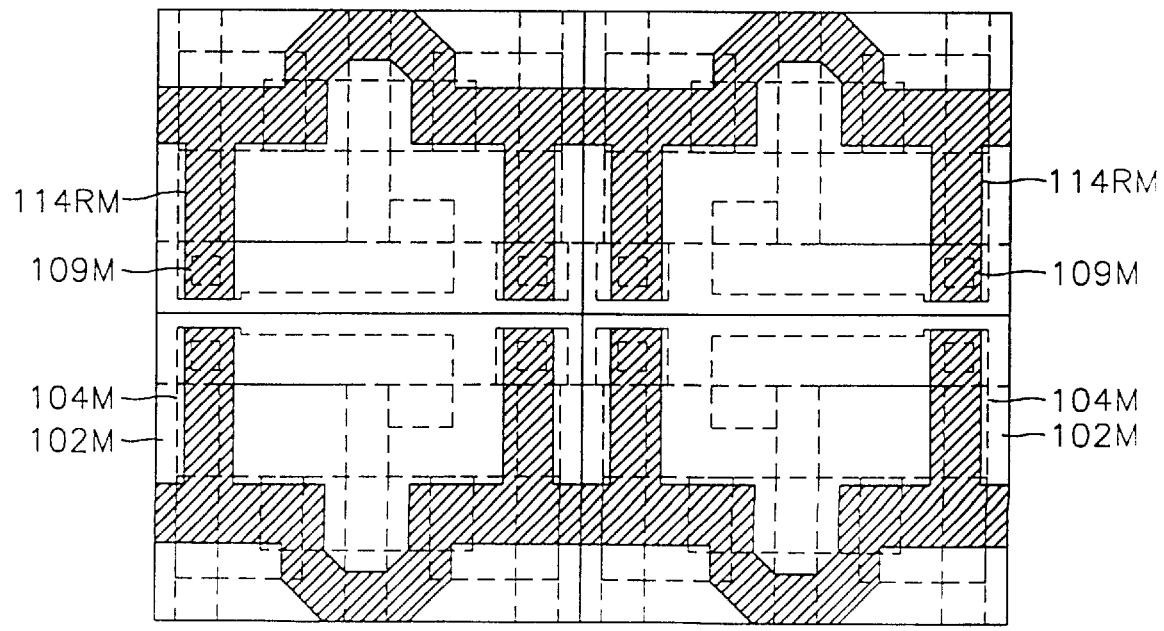
Figure 18:
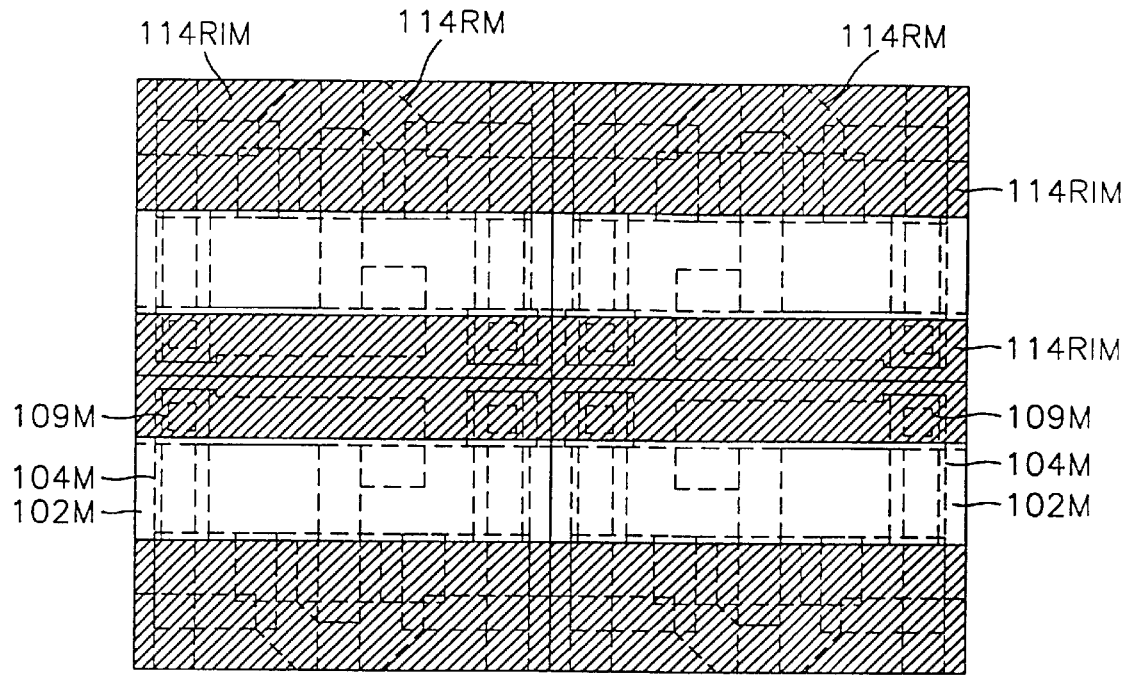
Figure 19:
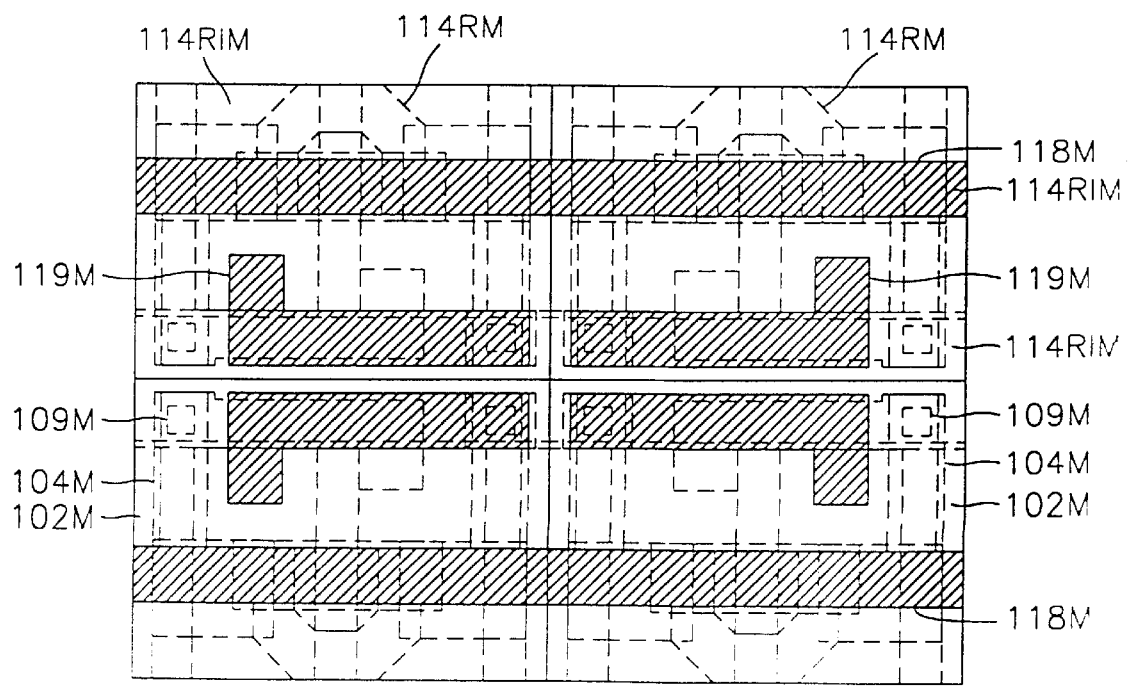
Figure 20:
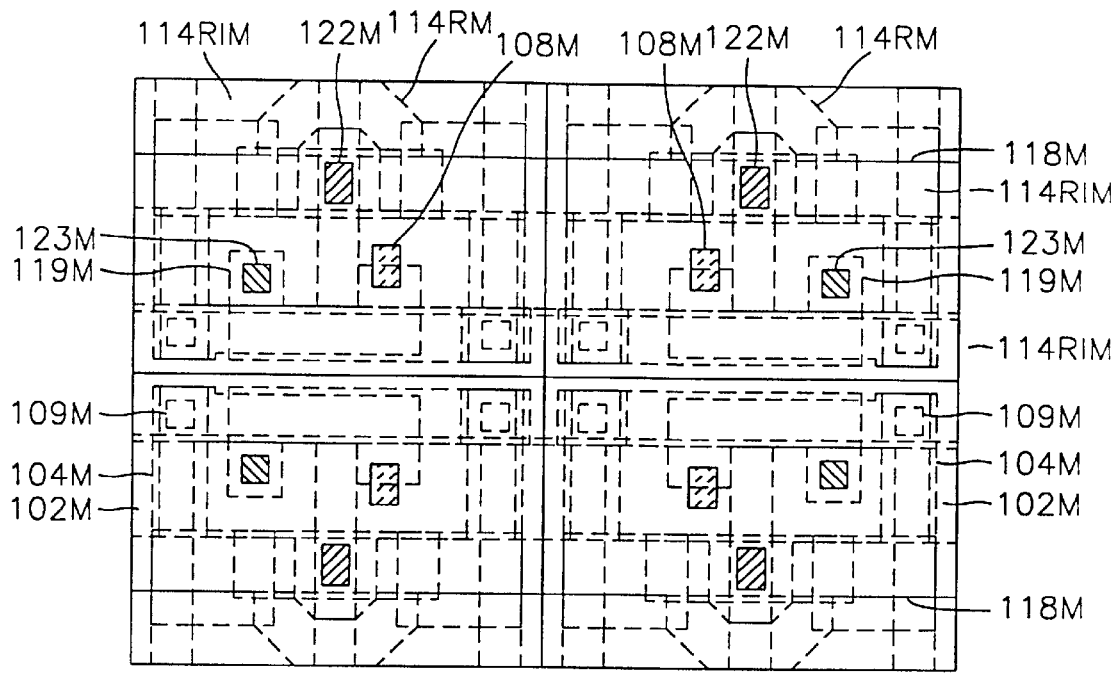
Figure 21:
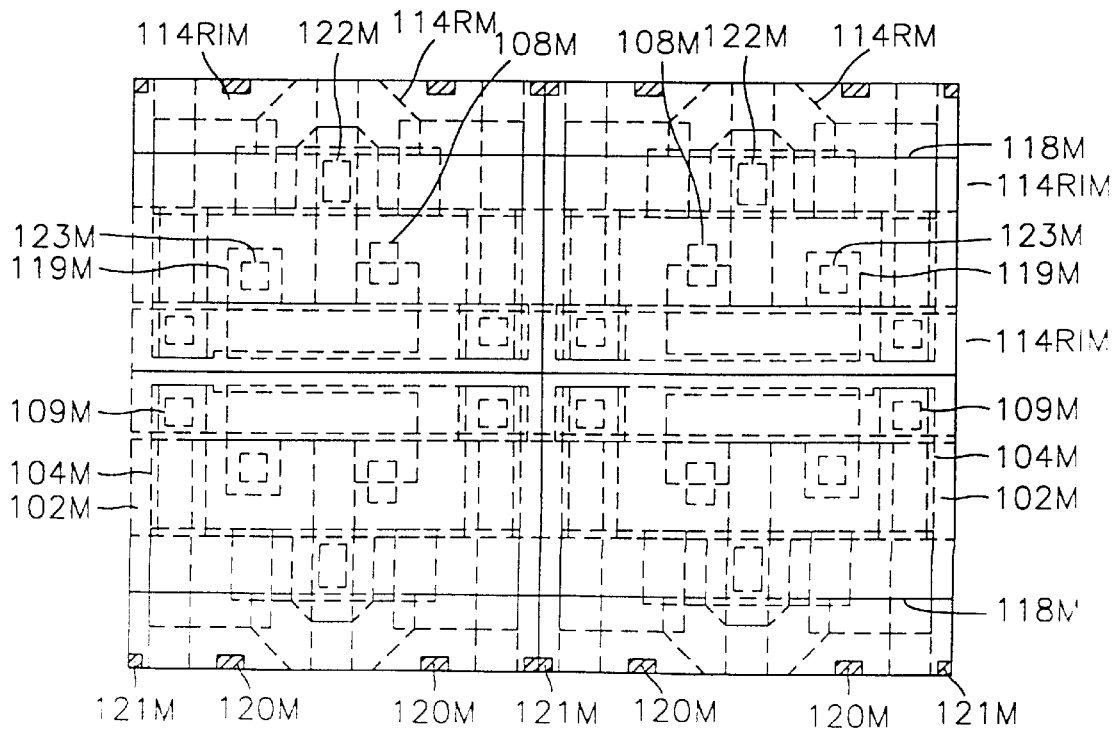
Figure 22:
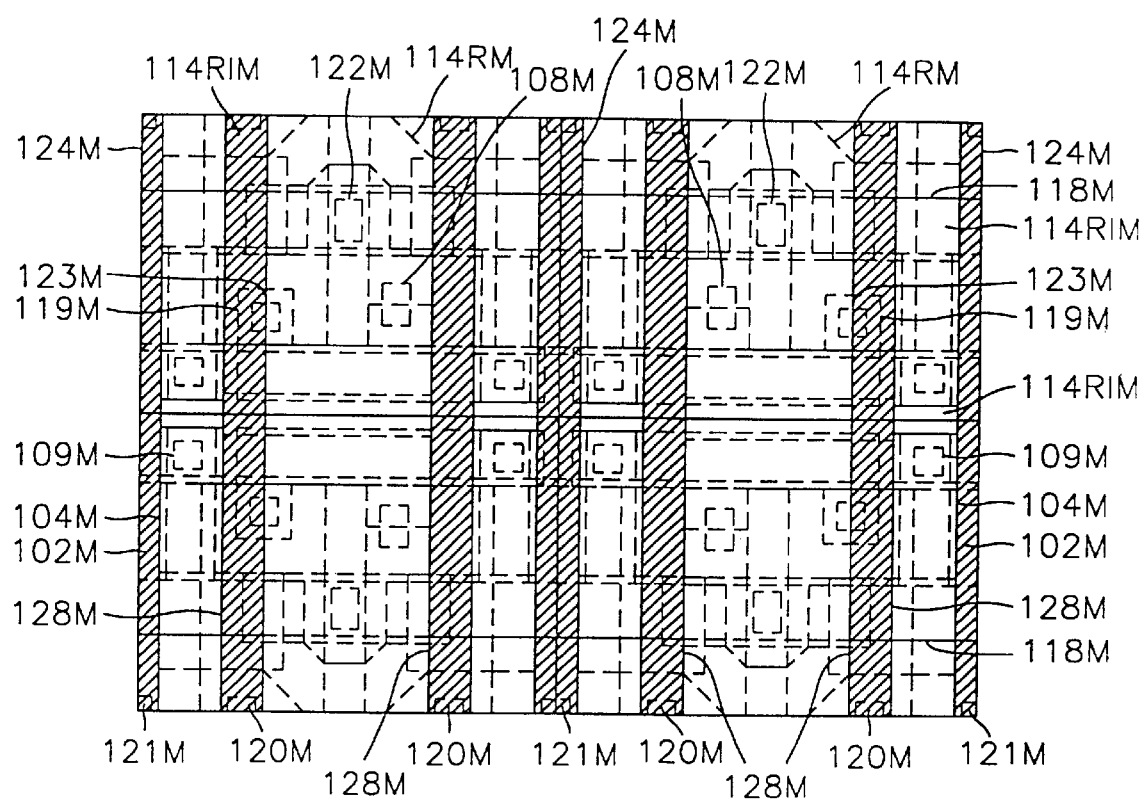

FIGS. 13, 13A and 13B illustrate the formation of a bit line 128 using a mask pattern 128M defining a bit line.

A metal layer, e.g., an aluminum layer is deposited on the entire surface of the resultant structure where the contact hole 126 for a bit line for exposing the contact plug 120P for a bit line is formed, and then the metal layer is patterned using the mask pattern 128M of FIG. 13, to thereby form two bit lines 128 for filling the contact hole 126 for a bit line and contacting with an active region of the substrate through the contact plug 120P for a bit line, in each memory cell.

As shown in FIG. 13A, a fourth parasitic capacitance C4 generated between the word line 122 and the bit line 128 can be reduced by increasing the thickness of the third interlevel dielectric layer 125. Problems generated by increasing the thickness of the second and third interlevel dielectric layer 115 and 125, which results in increase an aspect ratio of a contact hole for contacting the bit line with the active region, can be solved by adopting the process described with reference to FIGS. 12 and 13. That is, the contact plug 120P is formed in the second interlevel dielectric layer 115, and then only the third interlevel dielectric layer 125 is etched to form the contact hole 126 for exposing the contact plug 120P. Accordingly, problems caused by increase in the step can be easily solved.

Also, the mask patterns 114M for defining the power supply line of FIG. 9 or the mask patterns 118M for defining the word line of FIG. 10 are may be changed to define one power supply line or one word line in each cell. Thus, the unit memory cell of the SRAM of FIG. 2 may have one power supply line or one word line.

To fabricate the SRAM cell including a high-valued resistor as a load-device, according to a second embodiment, depicted in FIG. 3, processes for forming a gate of the PMOS TFT and a gate insulating layer illustrated in FIGS. 7 through 8B are not required, and a process for forming a high-valued resistor and power supply line, instead of the process of forming the active region of the PMOS TFT and power supply line illustrated in FIGS. 9, 9A and 9B, is performed. Other procedures are the same as illustrated in FIGS. 4 through 13B.

To fabricate the SRAM cell having a single word line and a single power supply line according to a third embodiment, depicted in FIG. 23, a process is carried out using a series of masks shown in FIGS. 14–22. In FIGS. 14–22, cross-hatched areas in each figure represent mask patterns formed on a piece of a photomask. For convenience, four adjacent SRAM cells are depicted in FIGS. 14–22.

In FIGS. 14–22, reference numeral 102M represents an active mask pattern; 104M represents an access transistor gate mask pattern; 106M represents a drive transistor gate mask pattern; 108M represents a cell node contact hole mask pattern; 109M represents a high-valued resistor contact hole mask pattern; 112M represents a word line contact hole mask pattern; 114RM represents a power supply line and high-valued resistor mask pattern; 114RIM represents an ion implantation mask pattern for a high valued resistor; 118M represents a word line damascene mask pattern; 119M represents a local interconnection damascene pattern for connecting a gate of a drive transistor with a source of an access transistor; 120M represents a bit line contact hole mask pattern; 121M represents a ground line contact hole mask pattern; 123M represents a local interconnection line contact hole mask pattern; 124M represents a ground line mask pattern; and 128M represents a bit line mask pattern.

Accordingly, the word line is shielded by the power supply line from the lower conductive regions, such as gate or lower impurity regions to thereby not generate the parasitic capacitances between the word line and the impurity region of the semiconductor substrate and between the word line and the gate of the drive transistor are not generated. Also, the parasitic capacitance between the power supply line and the word line is effectively reduced. Thus, the total amount of the parasitic capacitance of the word line is reduced, to thereby increase the operational speed and enhance performance of the SRAM device.

What is claimed is:

1. A semiconductor memory device having a memory cell comprising:

a semiconductor substrate;

first and second access transistors and first and second drive transistors formed on the semiconductor substrate, each transistor having a gate formed of a first conductive layer;

first and second power supply lines formed above said drive transistors and said access transistors, each power supply line being formed of a second conductive layer and insulated from said transistors; and first and second word lines formed above the first and second power supply lines, each word line being formed of a third conductive layer and insulated from the first and second power supply lines, said first word line connected to the gate of said first access transistor and said second word line connected to the gate of said second access transistor.

2. The device of claim 1, wherein the first and second power supply lines and the first and second word lines are arranged parallel with one another along a length of the word lines.

3. The device of claim 1, wherein the memory cell further comprises first and second load devices.

4. The device of claim 1, further comprising a ground line formed of the third conductive layer and connected to an active region of each of the first and second drive transistors.

5. A semiconductor memory device having a memory cell comprising:

a semiconductor substrate:

first and second access transistors and first and second drive transistors formed on the semiconductor substrate, each transistor having a gate formed of a first conductive layer;

first and second power supply lines formed above said drive transistors and said access transistors, each power supply line being formed of a second conductive layer and insulated from said transistors;

first and second word lines formed above the first and second power supply lines, each word line being formed of a third conductive layer and insulated from the first and second power supply lines, said first word line connected to the gate of said first access transistor and said second word line connected to the gate of the second access transistor; and first and second load devices, wherein the first and second load devices are first and second thin film transistors of a PMOS type, the first power line is connected to an active region of the first thin film transistor of a PMOS type, and the second power supply line is connected to an active region of the second thin film transistor of a PMOS type.

6. The device of claim 5, wherein the first and second power supply lines and the first and second word lines are arranged in parallel with one another along a length of the word lines.

7. The device of claim 5, further comprising a ground line formed of the third conductive layer and connected to an active region of each of the first and second drive transistors.

8. A semiconductor memory device having a memory cell comprising:

a semiconductor substrate;

first and second access transistors and first and second drive transistors formed on the semiconductor substrate, each transistor having a gate formed of a first conductive layer;

first and second power supply lines formed above said drive transistors and said access transistors, each power supply line being formed of a second conductive layer and insulated from said transistors;

first and second word lines formed above the first and second power supply lines, each word line being formed of a third conductive layer and insulated from the first and second power supply lines, said first word line connected to the gate of said first access transistor and said second word line connected to the gate of the second access transistor; and first and second load devices, wherein the first and second load devices are first and second high-valued polysilicon resistors, the first power supply line is connected to the first high-valued polysilicon resistor, and the second power supply line is connected to the second high-valued polysilicon resistor.

9. The device of claim 8, wherein the first and second power supply lines and the first and second word lines are arranged in parallel with one another along a length of the word lines.

10. The device of claim 8, further comprising a ground line formed of the third conductive layer and connected to an active region of each of the first and second drive transistors.

11. A semiconductor memory device having a memory cell comprising:

a semiconductor substrate;

first and second access transistors and first and second drive transistors formed on the semiconductor substrate, each transistor having a gate formed of a first conductive layer;

first and second power supply lines formed above said drive transistors and said access transistors, each power supply line being formed of a second conductive layer and insulated from said transistors;

first and second word lines formed above the first and second power supply lines, each word line being formed of a third conductive layer and insulated from the first and second power supply lines, said first word line connected to the gate of said first access transistor and said second word line connected to the gate of the second access transistor; and first and second bit lines formed above the first and second word lines and insulated from the first and second word lines.

12. The device of claim 11, wherein each of the first and second bit lines comprises:

a contact plug formed in first and second interlevel dielectric layers for insulating the semiconductor substrate, the power supply lines and the word lines respectively; and a fourth conductive layer pattern deposited in a contact hole formed in a third interlevel dielectric layer for insulating the word lines and the bit lines to expose the contact plug.

13. The device of claim 11, wherein the first and second power supply lines and the first and second word lines are arranged in parallel with one another along a length of the word lines.

14. The device of claim 11, further comprising a ground line formed of the third conductive layer and connected to an active region of each of the first and second drive transistors.

15. A semiconductor memory device comprising:

a semiconductor substrate;

two access transistors and two drive transistors formed on the semiconductor substrate, each transistor having a gate formed of a first conductive layer;

a power supply line formed above the access and drive transistors, said power supply line formed of a second conductive layer, insulated from the access and drive transistors; and a word line formed above the power supply line, said word line formed of a third conductive layer, insulated from the power supply line, and connected to each gate of the two access transistors.

* * * * *